(12) United States Patent
Romerein et al.

(10) Patent No.: US 7,974,586 B2
(45) Date of Patent: Jul. 5, 2011

(54) CONSTANT INPUT PORT IMPEDANCE FOR CATV AMPLIFIER WITH PASSIVE MODEM PORT

(75) Inventors: Robert L. Romerein, Pontypool (CA); Jay F. Shapson, Englishtown, NJ (US)

(73) Assignee: Extreme Broadband Engineering, LLC, Millstone Township, NJ (US)

( * ) Notice: Subject to any disclaimer, the term of this patent is extended or adjusted under 35 U.S.C. 154(b) by 963 days.

(21) Appl. No.: 11/900,988

(22) Filed: Sep. 14, 2007

(65) Prior Publication Data
US 2009/0077608 A1    Mar. 19, 2009

(51) Int. Cl.
*H04B 1/44* (2006.01)
(52) U.S. Cl. .......... 455/78; 455/572; 455/127.1; 455/83
(58) Field of Classification Search .................... 455/82, 455/572, 127.1, 83, 78, 127.3, 14, 15, 73, 455/79, 194.2, 273, 275, 277.1, 341; 725/127, 725/149, 126, 125, 121; 330/100; 327/108
See application file for complete search history.

(56) References Cited

U.S. PATENT DOCUMENTS

| | | | |
|---|---|---|---|
| 2005/0026571 A1* | 2/2005 | Yang et al. | 455/78 |
| 2005/0068223 A1* | 3/2005 | Vavik | 342/51 |
| 2006/0015921 A1 | 1/2006 | Vaughan | 725/127 |
| 2006/0205442 A1* | 9/2006 | Phillips et al. | 455/572 |

OTHER PUBLICATIONS

Anstine, Gerry; Advanced Services Drop Design; Dec. 12, 2004; 25 pages.

* cited by examiner

*Primary Examiner* — John Lee
(74) *Attorney, Agent, or Firm* — Watov & Kipnes, P.C.; Kenneth Watov

(57) ABSTRACT

A passive directional coupler is receptive of VoIP, Internet, and video/data signals, and is used in a CATV amplifier device to couple the video/data signals from a cable drop input port to the input terminal of an amplifier, and to passively bypass the VoIP and Internet signals to a modem port, for insuring continuous connection of the VoIP and Internet signals to the a modem of a user connected to the modem port, regardless of the loss of power to the amplifier or the failure of the amplifier, in one embodiment of the invention. In another embodiment, a switching circuit is responsive to the loss of power to the amplifier, for electrically connecting a 75 ohm resistor between a source of reference potential, and the common connection between the directional coupler and the amplifier, for maintaining a 75 ohm impedance at the directional coupler output to the common connection. In a preferred embodiment, the switching circuit also opens the common connection between the directional coupler and amplifier, upon the loss of power to the amplifier.

28 Claims, 10 Drawing Sheets

US 7,974,586 B2

CONSTANT INPUT PORT IMPEDANCE FOR CATV AMPLIFIER WITH PASSIVE MODEM PORT

RELATED APPLICATION

The present invention is related to co-pending Non-Provisional Ser. No. 11/520,908, filed on Sep. 14, 2006, the teachings of which are incorporated herein by reference to the extent they do not conflict herewith.

FIELD OF THE INVENTION

The present invention relates generally to amplifiers, and more specifically to amplifiers for use in cable television systems.

BACKGROUND OF THE INVENTION

A problem in present amplifiers used in cable television systems is that when there is a power outage or an amplifier otherwise becomes inoperative, the home or business user loses use of their cable modem for Internet communications. As a result, the home user will lose the use of VoIP (voice over internet protocol), and other access to the Internet. To avoid this problem bypass switching or switches have been installed in CATV systems to switch the feed cable or cable drop from the input of the amplifier directly to the input/output port of the modem. Also, relays have been used to accomplish this purpose when the amplifier loses power. There is a need in the art to improve upon present methods to maintain a home or business user's connection between their modem and the Internet in the event of an associated amplifier losing power or becoming defective.

SUMMARY OF THE INVENTION

In one embodiment of the invention a directional coupler is built into a CATV amplifier to receive a cable drop or feed providing video/data, VoIP, and other connection to the Internet, and to couple the VoIP signals and unamplified video/data signals directly to a passive output port or modem port for connection to the modem of the user, and further couple the video/data signals to the input of the amplifier. The output of the amplifier is connected directly to a video/data active output port for one embodiment of the invention, or via a splitter to a plurality of video/data active output ports for other embodiments of the invention, for providing amplified video/data signals.

In another embodiment of the invention for input signals having frequencies up to about 300 MHz, switching means are included to connect a 75 ohm resistor from an input connected to an input of the amplifier to ground or a source of reference potential, whenever power is interrupted to the amplifier, to insure maintenance of a 75 ohm input resistance at the input port to which the cable drop is connected, for signals having frequencies up to about 300 MHz (megahertz).

In a preferred and yet another embodiment, for applications having signal frequencies exceeding 300 MHz, in addition to connecting a 75 ohm resistor between an input terminal connected to the input of the amplifier and ground or a source of reference potential upon loss of amplifier power, the switching means also operates to open the connection between the input terminal and the input to the amplifier.

BRIEF DESCRIPTION OF THE DRAWINGS

Various embodiments of the invention are described below with reference to the drawings, in which like elements are identified by the same reference designation, wherein.

DETAILED DESCRIPTION OF THE INVENTION

Figure 1A:
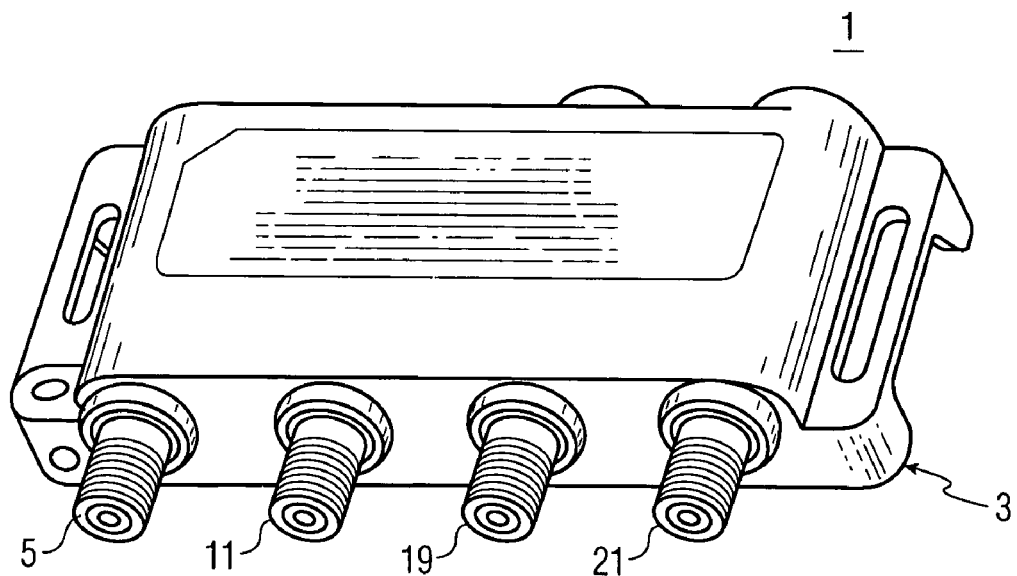
FIG. 1A is a pictorial view of an amplifier housing including an input port for a cable drop, a power port, a passive modem port, and one video/data output port for providing amplified signals, for one embodiment of the invention.
Figure 1B:
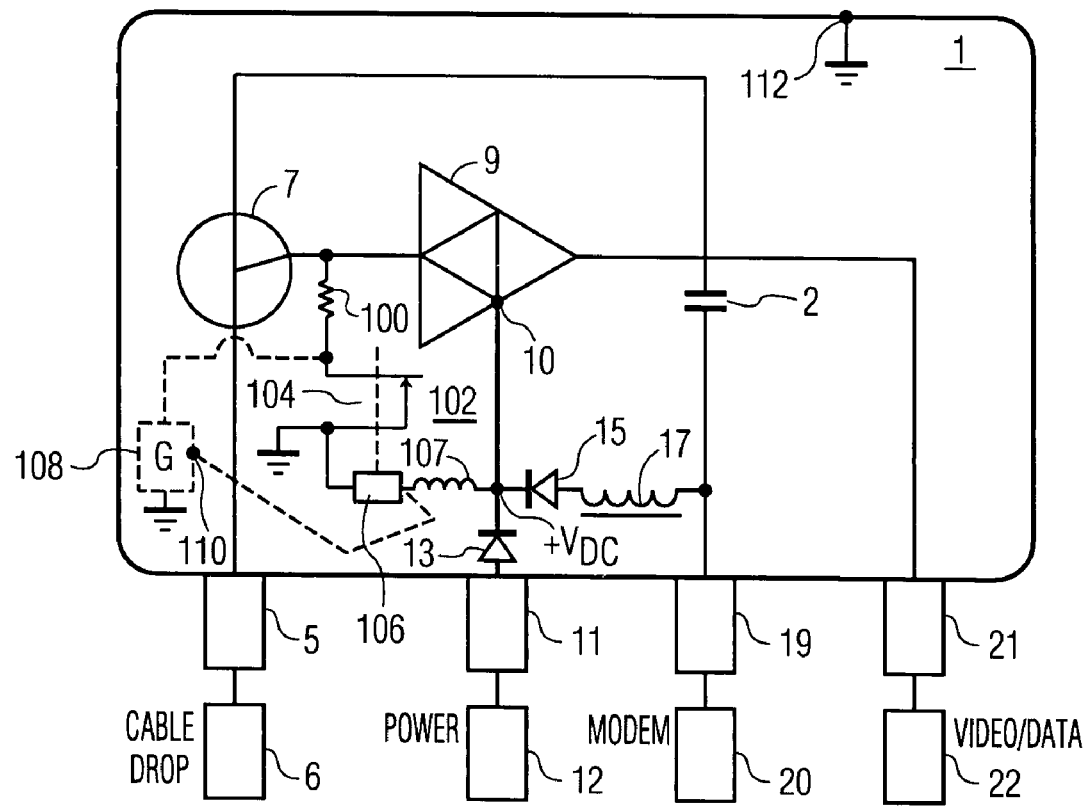
FIG. 1B is a block and electrical schematic diagram of the amplifier of FIG. 1A.

In FIG. 1A a one-output amplifier 1 having a housing 3 is shown for one embodiment of the invention. With reference to FIGS. 1A and 1B, the amplifier 1 includes an input port 5 for connection to a cable drop 6 or coaxial cable carrying video/data signals, VoIP, and Internet connection signals. Internally, the port 5 is electrically connected to a passive directional coupler 7 which partially bypasses a forward/reverse amplifier 9, and delivers or connects primary data services signals (Internet, VoIP, etc., at 2 dB down, in this example) directly to a passive modem port 19, along with unamplified video/data signals. Note that typically bidirectional or forward/reverse amplifiers, such as amplifier 9, include diplex filters (not shown) at their input and output connections. In this manner, if there is a power interruption to the amplifier 9 or a failure in the amplifier 9 itself, there will no interruption in the primary data service connection to the modem 20 of the home or business user. In this unique manner, compliance with e911 is provided. Directional coupler 7 also delivers or connects the video/data signals to an input of amplifier 9 (at −6 dB down, in this example). A power port 11 provides for connection to a DC voltage source 12, +12 VDC, in this example. A diode 13 is connected between the port 11 and the amplifier 9, and is polarized for passing the DC voltage to a power input terminal 10 of amplifier 9. Modem port 19 is connected through an inductor 17 for blocking high frequency signals in series with a diode 15 polarized for passing a positive DC voltage to amplifier 9, if power is to be provided thereto via a power inserter connected to modem port 19 rather than by connection of a source of positive DC voltage 12 to power port 11. A DC voltage blocking and RF bypass capacitor 2 is included between modem port 19 and directional coupler 7, to pass RF or video/data signals therebetween. In this embodiment, the output of amplifier 9 is connected directly to a single active output port 21 for delivering amplified video/data signals 22 to a user.

Figure 2A:
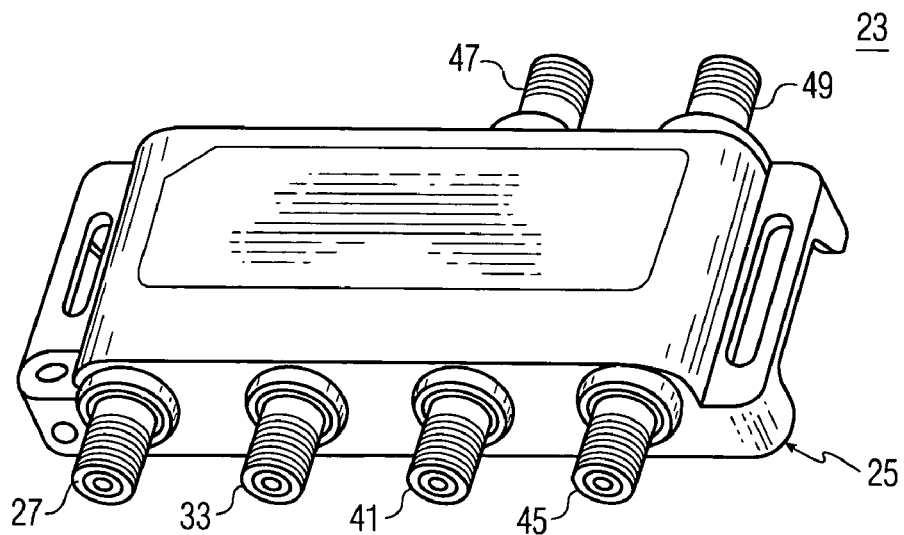
FIG. 2A is a pictorial view of an amplifier housing providing three amplified signal video/data output ports, and other ports relative to FIG. 1A, for a second embodiment of the invention.
Figure 2B:
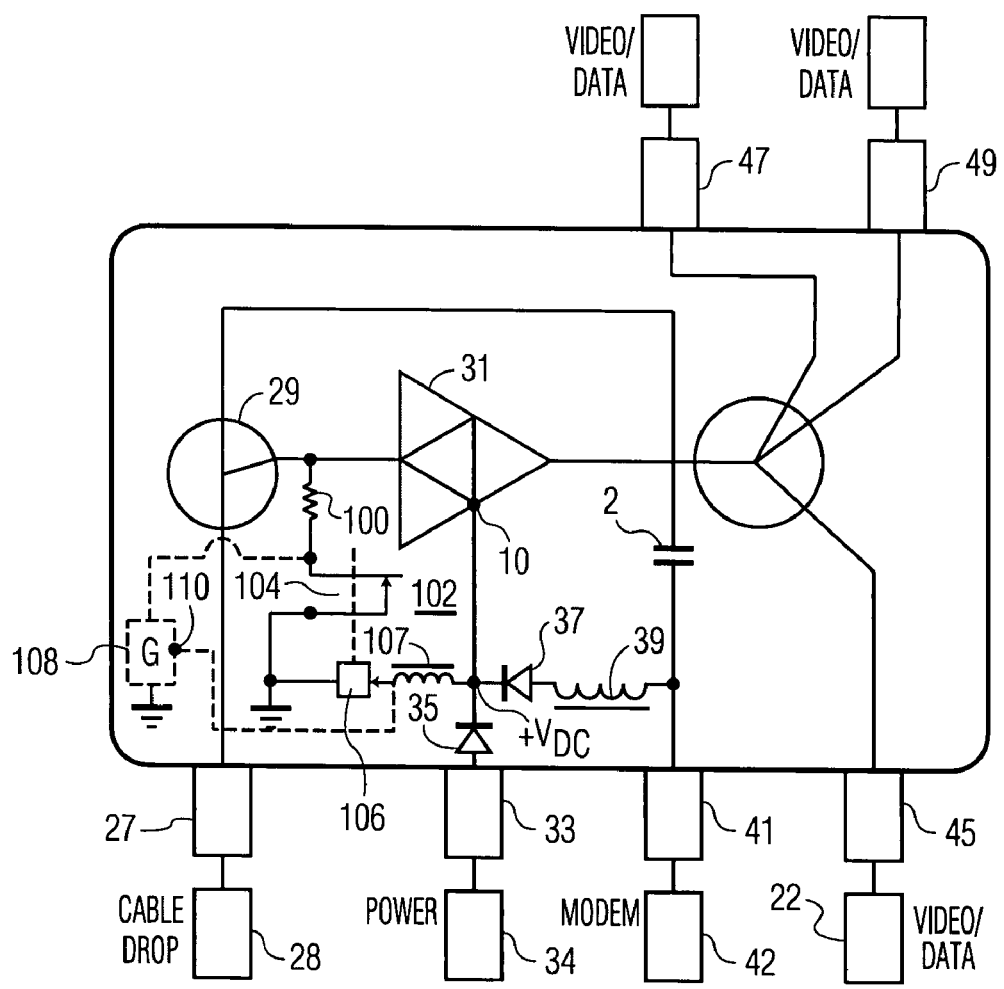
FIG. 2B is a block and electrical schematic diagram of the amplifier of FIG. 2A.

In FIG. 2A a three output amplifier device 23 having a housing 25 is shown for a second embodiment of the invention. With reference to FIGS. 2A and 2B, the amplifier device 23 includes an input port 27 for connection to a cable drop 28 or coaxial cable carrying video/data signals, and Internet connection signals. Internally, the port 27 is electrically connected to a passive directional coupler 29 which partially bypasses a forward/reverse amplifier 31, and delivers or connects primary data services (Internet, VoIP, etc., at −2 dB down, in this example) and unamplified video/data signals directly to a passive modem port 41. In this manner, if there is a power interruption to the amplifier 31 or a failure in the amplifier 31 itself, there will no interruption in the primary data service connection to the modem 42 of the home or business user. In this unique manner, compliance with e911 is provided. Directional coupler 29 also delivers or connects the video/data signals to an input of amplifier 31 (at −6dB down, in this example). A power port 33 provides for connection to a DC voltage source 34, +12 VDC, in this example. A diode 35 is connected between the port 33 and the amplifier 31, and is polarized for passing the DC voltage to amplifier 31. Modem port 41 is connected through an inductor 39 for blocking high frequency signals in series with a diode 37 polarized for passing a positive DC voltage to amplifier 31, if power is to be provided thereto via a power inserter connected to modem port 41 rather than by connection of a source of positive DC voltage 34 to power port 33. In this embodiment, the output of amplifier 31 is connected via a splitter 43 to three active video/data output ports 45, 47, and 49, for delivering amplified video/data signals thereto. Note that the splitter 43 is a passive device.

Figure 3A:
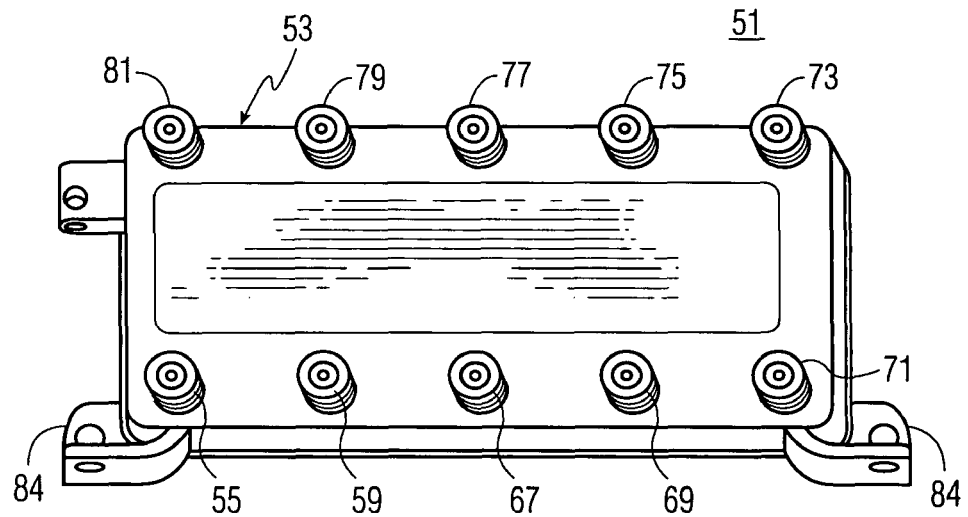
FIG. 3A is a pictorial view of an amplifier housing providing eight amplified signal video/data output ports, and other ports relative to FIG. 1A, for a third embodiment of the invention.
Figure 3B:
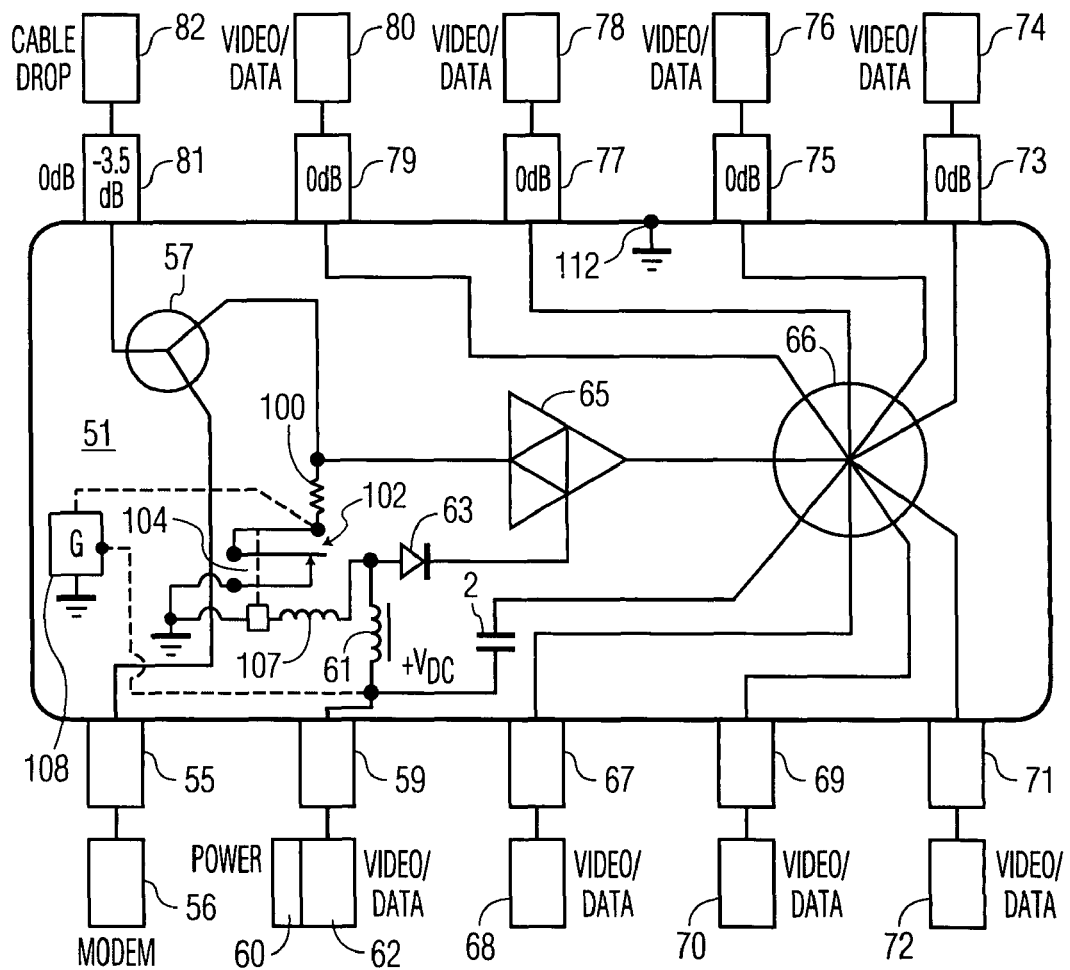
FIG. 3B is a block and electrical schematic diagram of the amplifier of FIG. 3A.

In FIG. 3A an eight output amplifier device 51 having a housing 53 is shown for a third embodiment of the invention. With reference to FIGS. 3A and 3B, the amplifier device 51 includes an input port 81 for connection to a cable drop 82 or coaxial cable carrying video/data signals, VoIP and Internet connection signals. Internally, the port 81 is electrically connected to a passive directional coupler 57 which partially bypasses a forward/reverse amplifier 65, and delivers or connects primary data services (Internet, VoIP, etc., at −3.5 dB down, in this example) and unamplified video/data signals directly to a passive modem port 55. In this manner, if there is a power interruption to the amplifier 65 or a failure in the amplifier 65 itself, there will no interruption in the primary data service connection to the modem 56 of the home or business user. In this unique manner, compliance with e911 is provided. Directional coupler 57 also delivers or connects the video/data signals to an input of amplifier 65 (at −3.5dB down, in this example). A combined video/data output and power input port 59 provides for connection to a DC voltage source 60, +12 VDC, in this example.

This video/data output and power input port 59 is connected through an inductor 61 for blocking high frequency signals in series with a diode 63 polarized for passing a positive DC voltage to amplifier 65, thereby permitting power to be provided thereto via either a power inserter or by a source 60 of positive DC voltage connected to power port 59. In this embodiment, the output of amplifier 65 is connected via a splitter 66 to eight video/data output ports 59, 67, 69, 71, 73, 75, 77, and 79, for providing amplified video/data signals 62, 68, 70, 72, 74, 76, 78, 80, and 82 thereto, respectively. Note that the splitter 66 is a passive device.

In engineering prototypes for the embodiment of the invention for FIGS. 1A and 1B, for FIGS. 2A and 2B, and for FIGS. 3A and 3B, respectively, gain in both the forward and reverse signal directions through the respective amplifiers 9, 31, and 65 is provided to maintain bidirectional signal symmetry at the cable system demarcation point. Also, in the embodiment of the invention of FIG. 3A, mounting tabs 84 are provided at the corners indicated, for permitting vertical or horizontal mounting of the housing 53 of the eight output amplifier device 51. Also, in each of the aforesaid embodiments of the invention, low power integrated circuits (ICs) were utilized in order to provide a small footprint, and to reduce or minimize cooling requirements. Also, through use of surface-mount components, the associated size of the housings required were minimized, and also provided for close control of the related electrical impedances and electrical isolation, for providing a linear frequency response in either forward or reverse signal directions, respectively.

In other embodiments of the invention, each of the embodiments of the invention, as shown in FIGS. 1B, 2B, and 3B, each also includes alternative switching circuit embodiments for connecting a 75 ohm resistor between an input to either one of amplifiers 9, 31, and 65, respectively, whenever power is lost or removed from the aforesaid amplifiers. Each alternative switching circuit is identical for each of the embodiments of FIGS. 1A through 3B. One alternative embodiment includes a 75 ohm resistor 100 connected between the input of an associated amplifier 9, 31, 65, respectively, and one end of normally closed (NC) relay contacts 104 of an electromechanical relay 102. The other end of relay contacts 104 is connected to a source of reference potential or ground (note that the housings 3, 25, and 53, each include a ground terminal 112). The electromechanical relay 102 has a solenoid coil 106 connected at one end via an RF choke or inductor 107 (although preferred for use, inductor 107's use is optional, the connection can be made directly) to a source of voltage $+V_{DC}$, for example, providing power to the associated amplifier 9, or 31, or 65. The other end of solenoid coil 106 is connected to ground. A choke or inductor may also be necessary when connecting the solenoid coil 106 to ground if the coil is inductively coupled to the RF path through the relay contacts due the construction of the relay. When power or $+V_{DC}$ is present, relay 102 is energized, and NC contacts 104 open, disconnecting the free end of resistor 100 from ground or a source of reference. Conversely, when power is lost ($+V_{DC}$ drops out for whatever reason), relay 102 is de-energized, causing contacts 104 to close, telminating the free end of resistor 100 to ground or a source of reference potential, for maintaining a 75 ohm impedance at the cable drop input port coupled to an input of the associated amplifier 9, or 31, or 65, respectively.

A second alternative switching circuit embodiment is shown in phantom in FIGS. 1B, 2B, and 3B. This embodiment uses a MOSFET switch 108 in place of relay 102. Note that the inventors believe that a silicon RF switch that includes the combination of a MOSFET transistor and a bandswitching diode, such as provided in silicon RF switches product numbers BF 1108, and BF 1108R, manufactured by Philips Semiconductors, can be applied for use as MOSFET switch 108. The gate of MOSFET switch 108 is connected via an inductor 107 (optionally a direct connection can be made) to $+V_{DC}$, and the source-drain path thereof connected between the free end of resistor 100 and ground. When $+V_{DC}$ is present, MOSFET switch 108 has a very high resistance or impedance in its source-drain path, effectively disconnecting the free end of resistor 100 from ground. When $+V_{DC}$ is not present, the impedance between the source and drain electrodes reduces to a very low value in the inoperative state of MOSFET 108, thereby connecting the free end of resistor 100 to ground.

Figure 4:
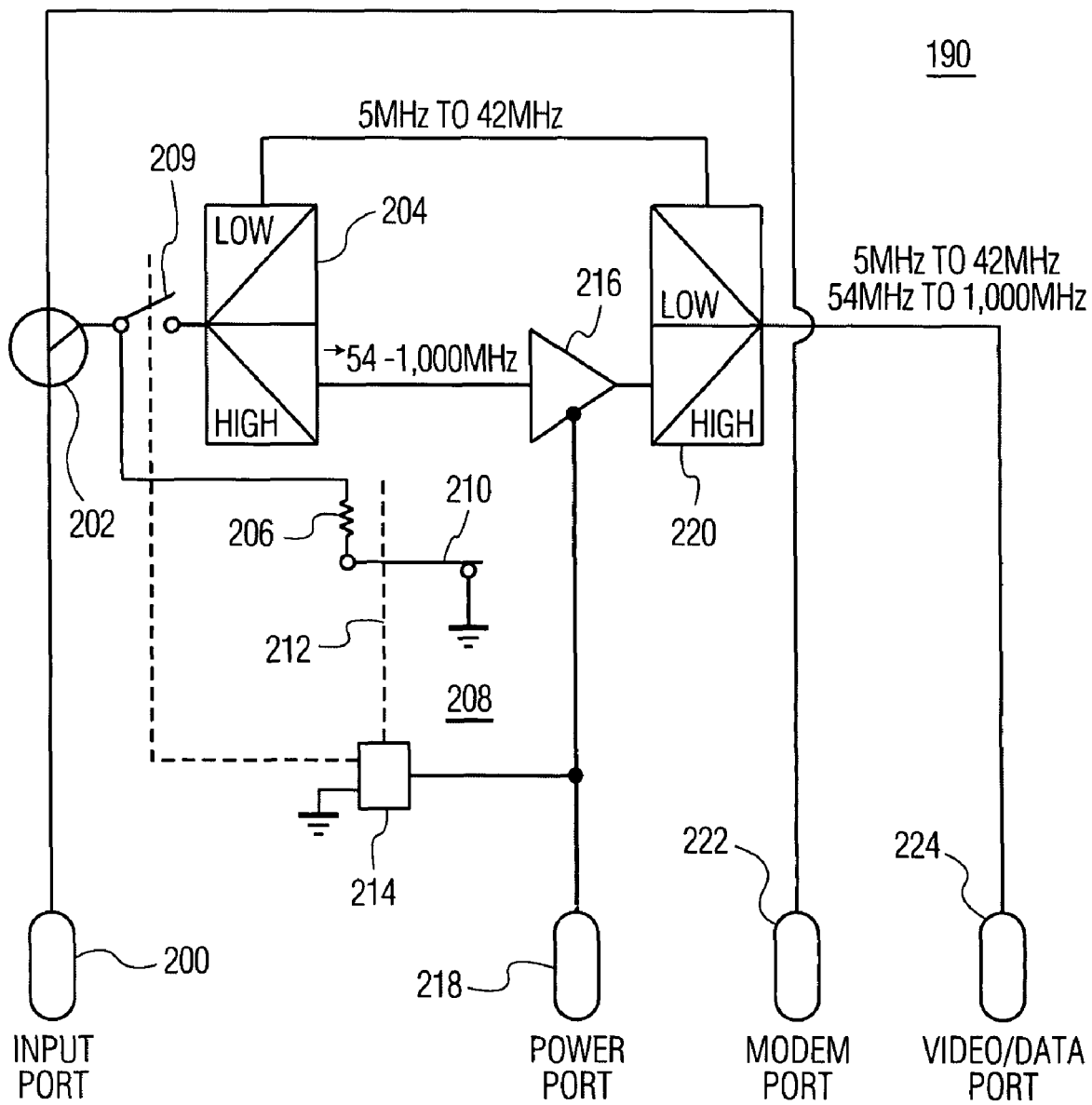
FIGS. 4 through 10 show a block and electrical schematic diagrams for other embodiments of the invention, respectively.

Typically the CATV forward/reverse or bidirectional amplifiers such as 9, 31, 65, of FIGS. 1B, 2B, and 3B, respectively, each includes a first diplex filter for receiving and filtering the input signals to the associated amplifier circuit, and a second diplex filter at the output of the amplifier circuit. FIG. 4 is similar to the circuitry of FIG. 1B, but shows the first and second diplex filters. More specifically, with reference to FIG. 4, the amplifier circuitry includes a first diplex filter 204, a unidirectional amplifier 216, and a second diplex filter 220. A relay 208, and a directional coupler 202 are also included.

In this example, these components provide a CATV amplifier device 190, for amplifying RF signals in a range of 54 MHz to 1,000 MHz, and passively passing RF signals in the range of 5 MHz to 42 MHz, in this example. The directional coupler 202 feeds video/data signals from an input port 200 providing a cable drop to both normally open relay contacts of electromechanical relay 208, and directly and passively to a modem port 222. The relay 208 includes normally open contacts 209, normally closed contacts 210, and an energization coil 214.

Operation and greater details of the CATV amplifier device 190 of FIG. 4 will now be described. A cable drop is connected to input port 200 for permitting the bidirectional flow of data between device 190 and a main CATV cable, and the connection of video signals to device 190. Power, typically a DC voltage, is connected from a source of power (not shown) to power port 218, for providing power to both amplifier 216, and to one end of the electromagnetic coil 214 of relay 208, the other end of which is connected to ground or a source of reference potential. Input port 200 is connected to an input of a directional coupler 202. One output of directional coupler 202 passively connects video/data signals to modem port 222. Another output of directional coupler 202 is in this example connected to one end of normally open contacts 209, the other end of the latter being connected to one input of the first diplex filter 204. The output of filter 204 is connected to the input of forward/reverse amplifier 216. A 75 ohm resistor 206 is connected between the common connection of coupler 202 and normally open (NO) contacts 209, and an end of normally closed contacts 210, the other end of the latter being connected to ground or a source of reference potential. The output of amplifier 216 is connected to one input of diplex filter 220. Filters 204 and 220 are connected together to pass low band signals therebetween. An output of filter 220 is connected to video/data port 224.

During normal operation of CATV amplifier device 190, power ($V_{DC}$) from power port 218 powers amplifier 216 and energizes coil 214 of relay 208. When relay 208 is so energized, contacts 210 open for disconnecting resistor 206 from ground, and contacts 209 close for connecting directional coupler 202 to filter 204. With power present, as indicated, video/data signals are passively connected via coupler 202 between input port 200 and modem port 222. In this example, video/data in a frequency range from 54 MHz to 1,000 MHz can flow through filter 204, amplifier 216, and filter 220. Amplifier 216 amplifies the signals. Since amplifier 216 is a unidirectional device, diplex filters 204 and 220 provide a separate path for signals in the frequency range of 5 MHz to 42 MHz to flow in the opposite direction from the video/data port to the input port. As a result, signals having a frequency range of 54 MHz to 1,000 MHz are amplified in the forward direction between input port 200 and video/data port 224, and signals having frequencies lower than 54 MHz passively flow therebetween. As it is known in the art, there is 12 MHz frequency gap between the forward direction high band and reverse direction low band signals.

If power is lost at power port 218, amplifier 216 and relay 208 are de-energized. As a result, relay contacts 209 open for disconnecting directional coupler 202 from filter 204, to insure the impedance of the passive reverse frequency band of signals is not adversely affected. Also, relay contacts 210 close to connect resistor 206 between the directional coupler 202 and ground or a source of reference potential to insure the maintenance of a 75 ohm impedance at input port 200, for the passive flow of signals between modem port 222 and input port 200. Also, the flow of signals to video/data port 224 is terminated. Note that relay 208 can be replaced with solid-state switching devices, and the use of a relay is not meant to be limiting.

In the embodiments of the invention as shown in FIGS. 1B, 2B, and 3B, for signal frequencies below 300 MHz, clamping of the connection between the associated directional couplers 7, 29, 57, and their associated amplifiers 9, 31, 65, respectively, to a 75 ohm resistor 100 to ground typically suffices to maintain a 75 ohm input port impedance. However, for signal frequencies greater than 300 MHz, and for the preferred embodiment of the invention, it is necessary to also open the connection between each amplifier 9, 31, 65, and its associated directional coupler 7, 29, 57, respectively, as well as connect the 75 ohm resistor 100 between each directional coupler and ground as previously described for the embodiment of FIG. 4, upon loss of power.

Figure 5:
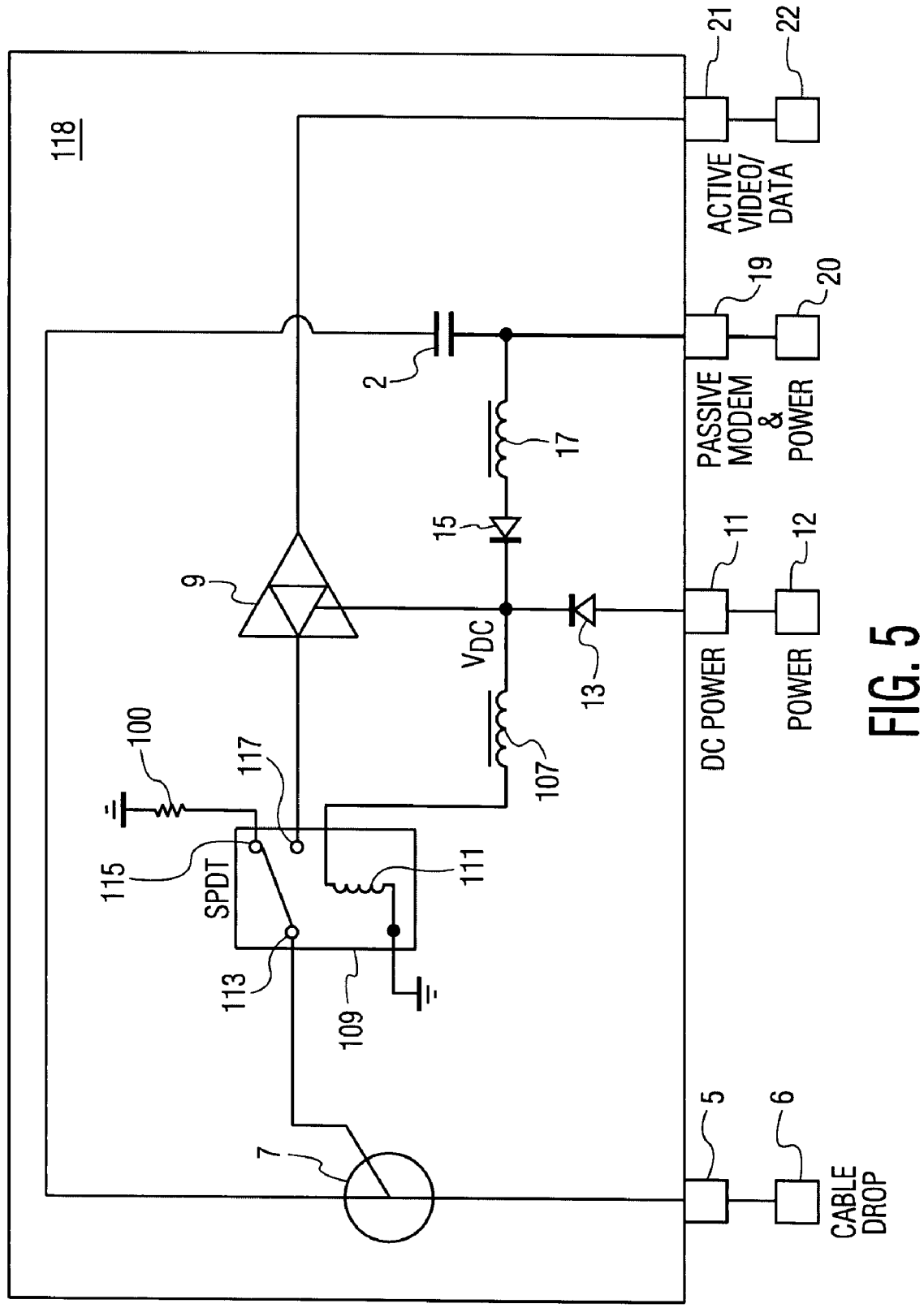

In FIG. 5, another embodiment of the invention shows an amplifier device 118 that is a modification of the amplifier device 1 of FIG. 1B. More specifically, the amplifier device 118 differs from amplifier device 1 in that the single-pole-single-throw relay 102 of amplifier device 1 is replaced by a single-pole-double-throw relay 109, to insure maintenance of a 75 ohm input impedance in the reverse signal direction from port 19 through directional coupler 7 to input port 5, particularly for operation with frequencies greater than 300 MHz. In operation of the amplifier device 118, at times that power is being applied to amplifier 9, relay 109 is energized through the application of an operating voltage to its solenoid coil 111, causing contacts 113 and 117 to be electrically connected together, thereby providing electrical connection between directional coupler 7 and the input of amplifier 9. If power drops out or is removed from amplifier 9 for any reason, relay 109 is de-energized, whereby the connection between relay terminals 113 and 117 is opened, the electrical connection between contacts 113 and 115 is established, thereby removing the input of amplifier 9 from the circuit, and terminating the connection from directional coupler 7 through a 75 ohm resistor 100 to ground.

Figure 6:
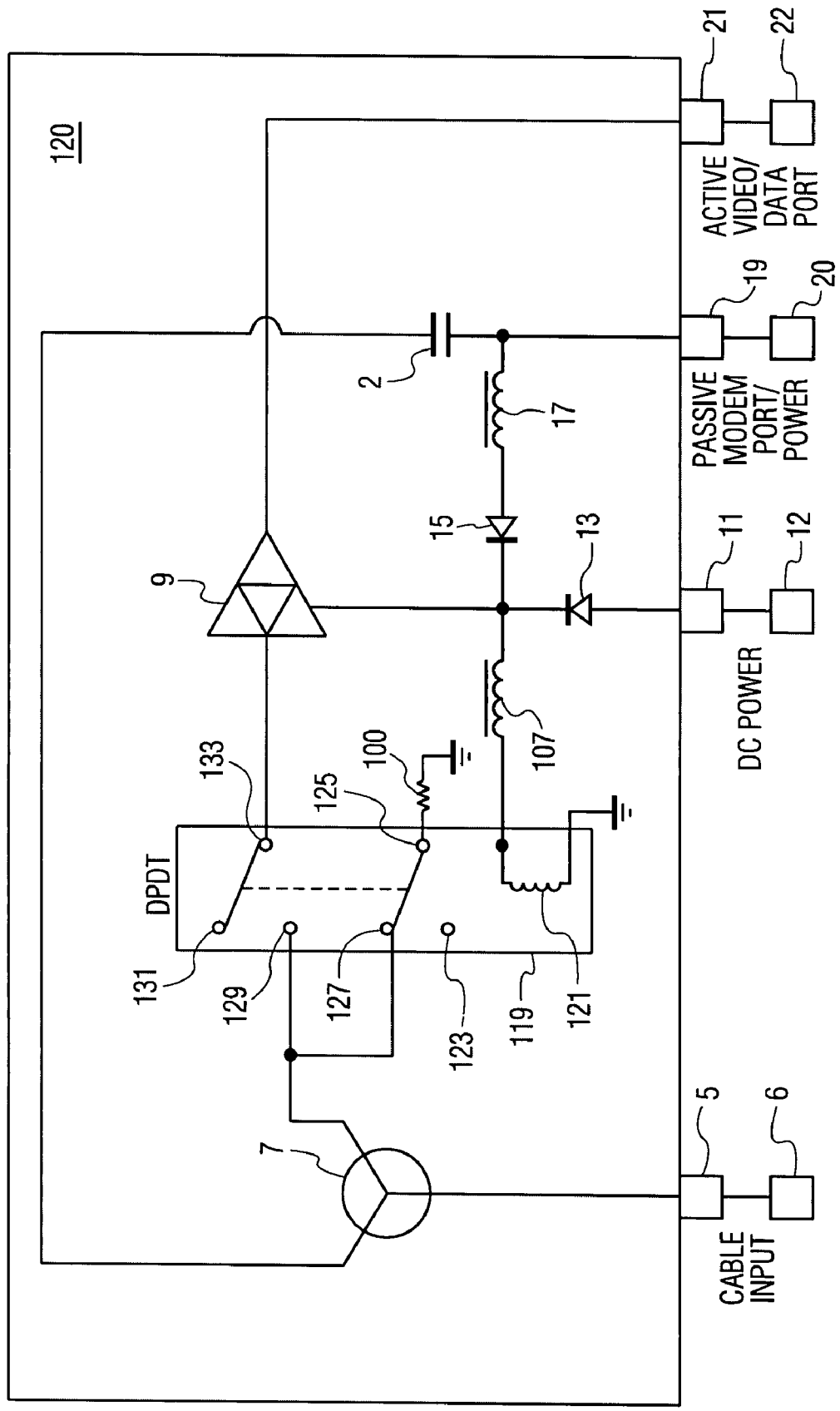

In the embodiment of the invention of FIG. 6, amplifier device 120 substitutes a double-pole-double-throw relay 119 for the single-pole-double-throw relay 109 of the amplifier device 118 of FIG. 5. As shown in FIG. 6, when relay 119 is energized through the application of power to its solenoid coil 121, this corresponds with the application of power to amplifier 9, and relay contacts 129 and 133 are electrically connected together for in turn electrically connecting directional coupler 7 to the input of amplifier 9. Also, at this time 75 ohm resistor 100 is removed from the circuit in that relay contacts 123 and 125 are electrically connected together keeping open the free end of resistor 100 connected to contact 125. If power is lost to amplifier 9 and relay 119, the contacts of relay 119 will be as shown in FIG. 6, whereby relay contacts 131 and 133 are electrically connected together, and the connection between relay contacts 129 and 133 is opened, thereby electrically disconnecting directional coupler 7 from the input of amplifier 9. Also, during loss of power to relay 119, relay contacts 125 and 127 are electrically connected together for terminating the connection of directional coupler 7 to the 75 ohm resistor 100, as shown.

Figure 7:
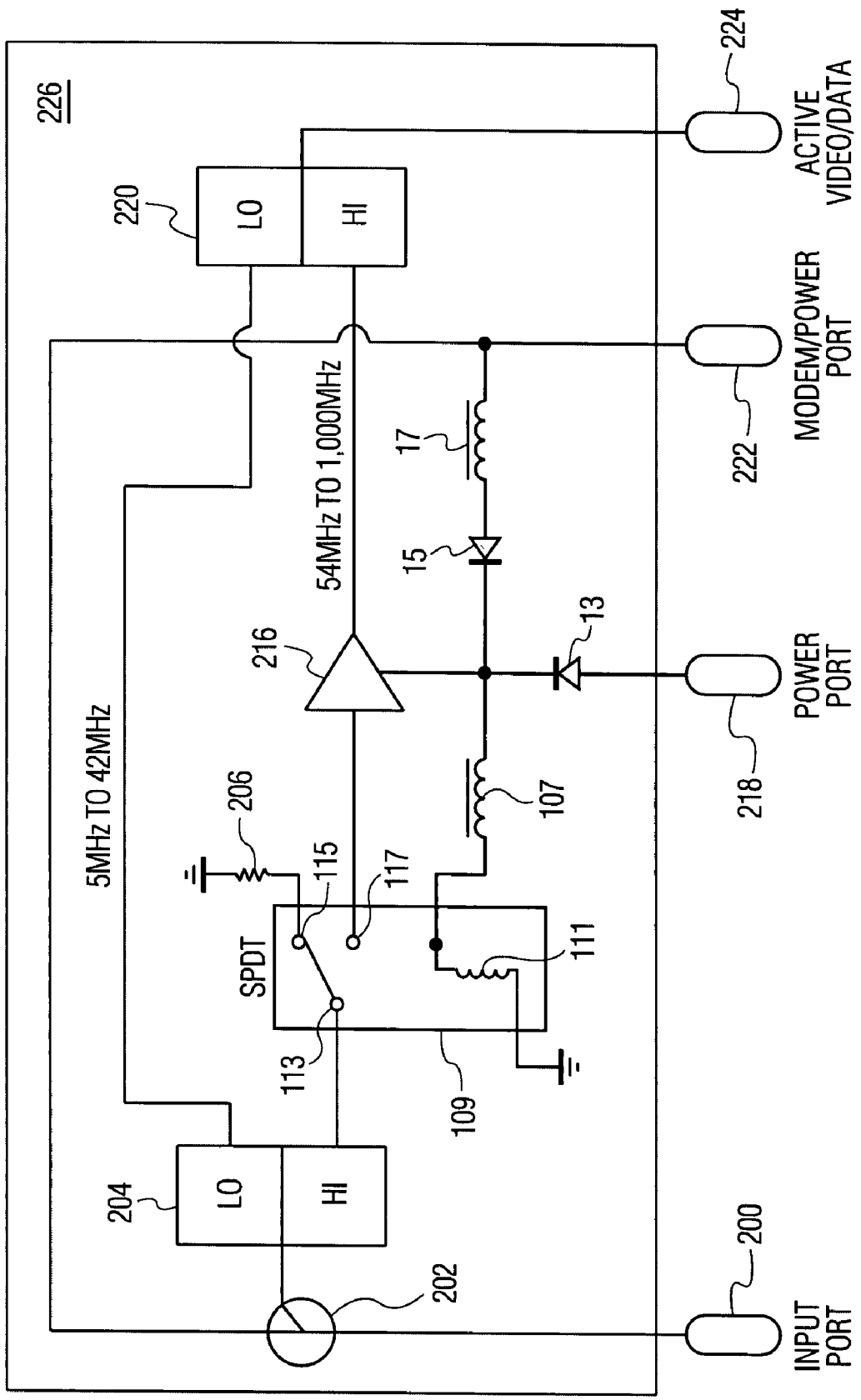

In FIG. 7, another alternative embodiment of the invention is shown for an amplifier device 226 that is a modification of the amplifier device 190 of FIG. 4. More specifically, in an amplifier device 226 a single-pole-double-throw relay 109 is connected as shown between diplex filter 204 and amplifier 216. When power is lost to amplifier 216, relay 109 is de-energized, causing relay contacts 113 and 115 to be electrically connected together for terminating the "Hi" output of diplex filter 204 through 75 ohm resistor 206 to ground, as shown. When power is applied to the relay coil 111 for energizing relay 109, the electrical connection between relay contacts 113 and 115 is open, and an electrical connection between relay contacts 113 and 117 is established for electrically connecting the "Hi" output of diplex filter 204 to the input of amplifier 216.

Figure 8:
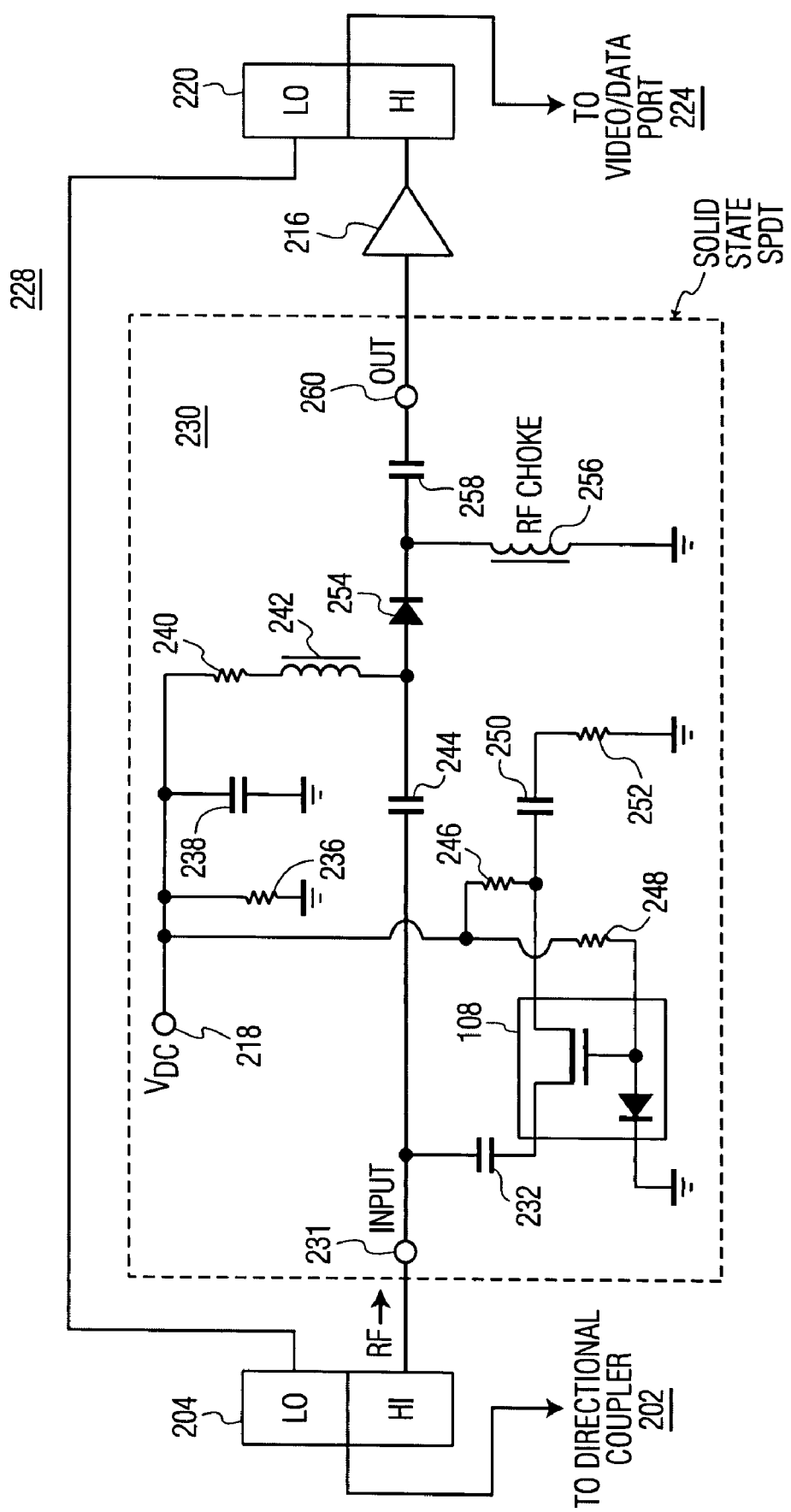

In FIG. 8, an alternative amplifier device 228 is shown which is similar to the embodiment of the invention of FIG. 7. Rather than using an electromechanical relay 208 as shown for amplifier device 190 of FIG. 7, the alternative embodiment of FIG. 8 includes a solid-state switching circuit 230 that is equivalent to an electromechanical single-pole-double-throw relay connected between diplex filter 204 and the input of amplifier 216. More specifically, the solid-state relay 230 has an input terminal 231 connected to the "Hi" output of diplex filter 204, and an output terminal 260 connected to the input of amplifier of 216. The solid-state relay or switching circuit 230 further includes an AC or RF bypass capacitor 232 connected between input terminal 231 and one end of the main current path of a MOSFET switch 108 (previously described above). The other end of the MOSFET switch 108 is connected to the common connection of one end of another RF bypass capacitor 250, and one end of current limiting resistor 246. The other end of RF bypass capacitor 250 is connected through a resistor 262 to ground. Resistor 252 is of a value for insuring that a 75 ohm impedance is maintained between input terminal 231 and ground at times that power is lost to amplifier 216. The gate or control terminal of MOSFET switch 108 is connected through a current limiting resistor 248 to the common connection of the other end of the current limiting resistor 246, the power terminal 218, for receiving a DC voltage $V_{DC}$ when power is being maintained to amplifier 216, and to an RF filter that includes resistor 236, capacitor 238, resistor 240, and RF choke 242, all connected as shown. Input terminal 231 is also connected through an RF bypass capacitor 244 to the anode of a pin diode 254. As shown, the anode of pin diode 254 is also connected to one end of the RF choke 242. The cathode of pin diode 254 is connected to the common connection of one end of an RF bypass capacitor 258, and one end of an RF choke 256, the other end of the latter being connected to ground. The other end of bypass capacitor 258 is connected to output terminal 260. The manner of operation follows. Whenever power is applied to amplifier 216, it is also applied to input terminal 218, of the solid-state switching circuit 230, causing the pin diode 254 to pass RF signals from bypass capacitor 244 through bypass capacitor 258 to the input of amplifier 216. Also, when power is applied to amplifier 216 in the solid-state switching circuit 230, MOSFET switch 108 is turned off, electrically disconnecting resistor 252 from input terminal 231. When power is lost or dropped out from amplifier 216, it is also removed from power terminal 218 of the solid-state switch 230, causing the pin diode 254 to become backbiased, preventing signal flow from diplex filter 204 through the solid-state switch 230 to the amplifier 216. Also, as previously discussed, when power is lost, MOSFET switch 108 operates to lower the resistance of its main current path for effectively connecting resistor 252 between input terminal 231 and ground.

Figure 9:
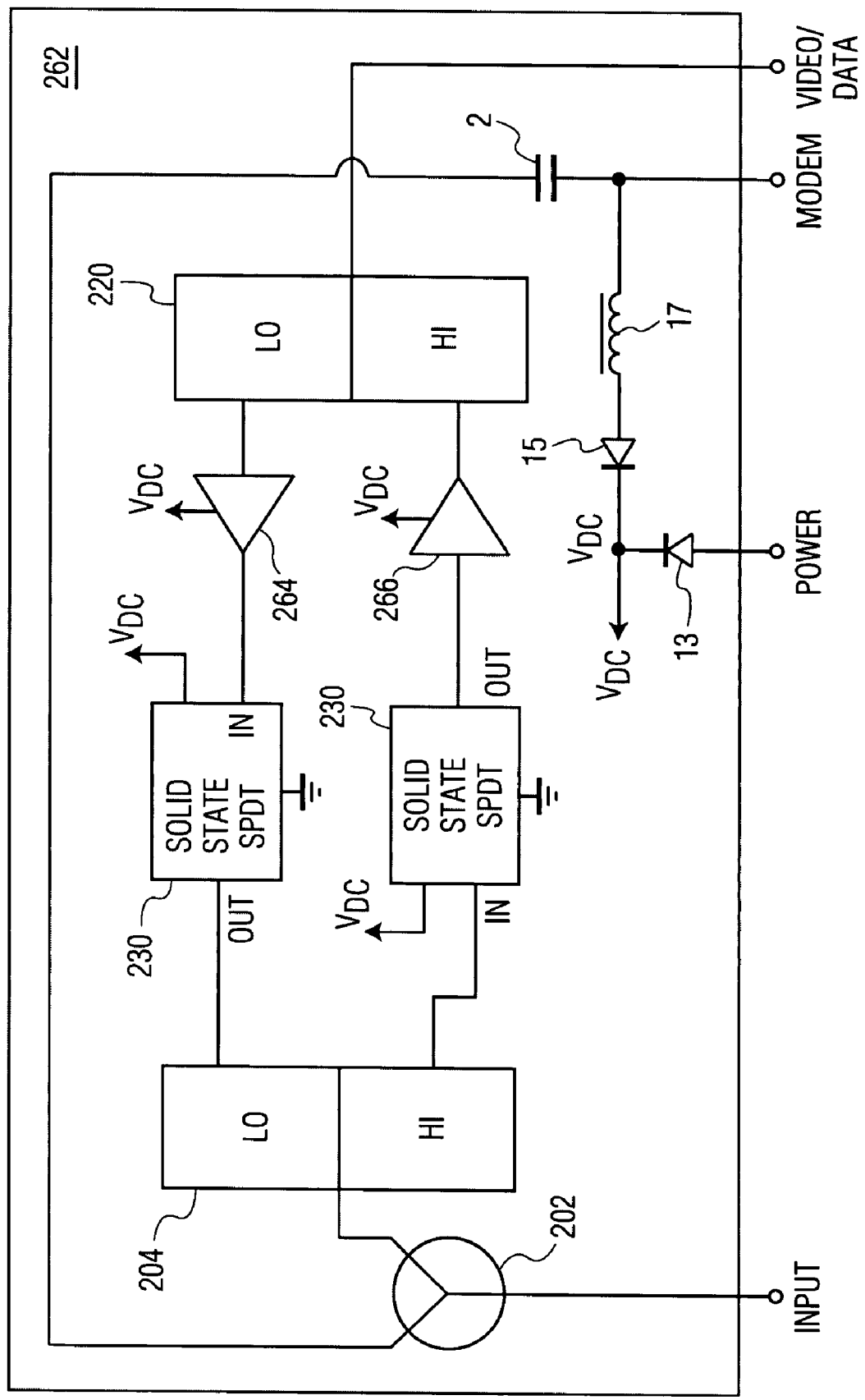

In FIG. 9, another embodiment of the invention for a CATV amplifier device 262 is shown that includes the diplex filters 204 and 220, two solid-state switching devices 230 for providing a single-pole-double-throw switching function, respectively, a forward signal flow amplifier 266, and a reverse signal flow amplifier 264, connected as shown, along with other components as described in previous embodiments of the invention. When power is applied to amplifier 264 and sold-state switch 230 coupled to the output thereof, the associated solid-state switch 230 electrically connects the "Lo" of the diplex filter 204 to the output of amplifier 264. Similarly, when power is being applied to amplifier 266 and its associated solid-state switch 230, the latter is operative to electrically interconnect the "Hi" portion of diplex filter 204 to the input of amplifier 266. When power is simultaneously lost to amplifier 264, and to the associated solid-state switching circuit 230, the latter when so de-energized connects the "Lo" portion of diplex filter 204 through resistor 252 (see FIG. 8) to ground, for maintaining a 75 ohm impedance, and also electrically disconnects the output of amplifier 264 from diplex filter 204. Similarly, when amplifier 266 and its associated solid-state switch 230 are receiving power, the solid-state switching circuit 230 electrically connects the "Hi" portion of diplex filter 204 to the input of amplifier 266. When power is removed from the amplifier 266 and the solid-state switching circuit 108, the latter in its de-energized state causes the "Hi" portion of diplex filter 204 to be terminated through resistor 252 to ground for maintaining a 75 ohm impedance, and electrically disconnects the input of amplifier 266 from the "Hi" portion of diplex filter 204.

Figure 10:
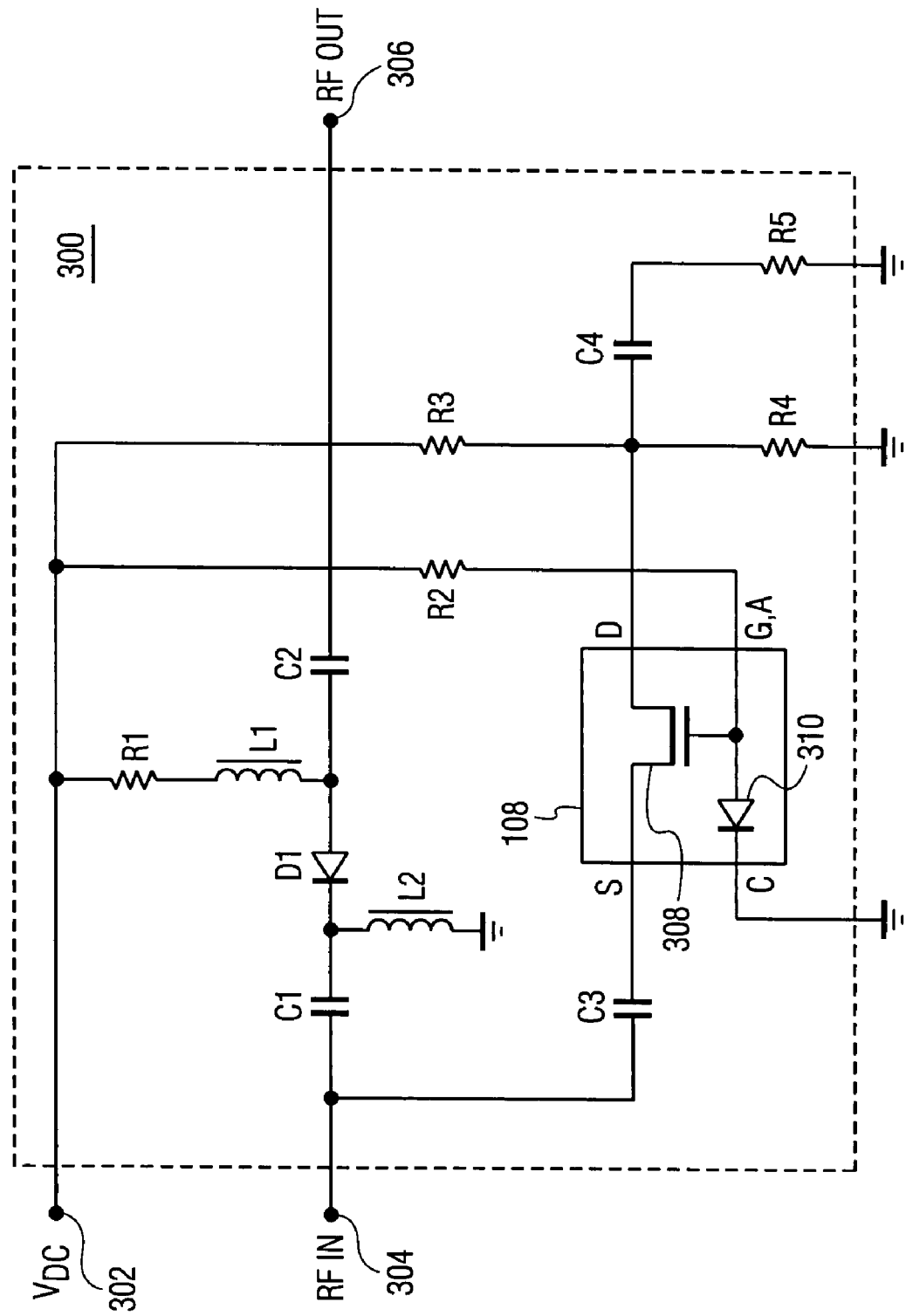

In FIG. 10, another embodiment of the invention for an electronic or solid-state equivalent circuit 300 for an electromechanical single-pole-double-throw relay (SPDT) is shown. This SPDT circuit 300 is an alternative to SPDT 230 of FIGS. 8 and 9.

The purpose of this SPDT RF relay circuit 300 is to conduct RF signals from the RF input 304 through RF diode D1 to the RF output 306 when DC voltage is present at the $V_{DC}$ terminal 302. When this voltage is removed, D1 will isolate the signal path with high impedance and the signal continuity from the RF input 304 will be routed to the termination resistor R5 due to the activation of MOSFET switch 108. This action preserves the characteristic impedance at the RF input 304 regardless of the conduction state of the solid-state relay 300.

The N channel MOSFET RF switch 108 (a BF 1108 as previously mentioned, for example) has the property of conducting signals from the source to the drain of its MOSFET switch 308 when the voltage at the drain is zero volts. The diode 310 contained within switch 108 insures that the capacitance at the gate of the MOSFET 308 is very small when $V_{DC}$ is zero volts. This insures high frequency operation to at least 1 GHz.

The ON resistance of the RF switch 108 is about twelve ohms. The value of resistor R5 is chosen to supply a termination resistance characteristic of the impedance of the RF circuit. Typically, this impedance is 50 or 75 ohms, for example.

Capacitors C1 through C4 are used to each provide a bypass path for RF signals without affecting the DC bias current paths due to their infinite DC resistance and low RF impedance at the frequencies used in the application. Inductors L1 and L2 are used to provide DC bias current paths without affecting the RF signal paths due to their low DC resistance and high RF impedance at the frequencies used in the circuit application. R1 supplies current through diode D1. Its value is chosen to forward bias the diode D1 to reduce its impedance to RF signals. Typically, the current will be on the order of 10 ma (milliamperes) for small signal RF applications, in this example. Resistor R2 similarly supplies current to the diode D1 and voltage to the gate of MOSFET transistor 308. This biases MOSFET 308 to its OFF state. Resistors R3 and R4 form a voltage divider to insure that the voltage at the Drain of MOSFET 308 does not exceed its rated maximum voltage. When voltage is present at the Drain, MOSFET 308 is in its OFF or nonconductive state. The values of these resistors R3, R4 are on the order of a hundred times higher than the value of the termination resistor R5 so that they will not affect the termination impedance. An example of component values for the circuit of FIG. 10 is shown below in Table 1.

TABLE 1

| | |
|---|---|
| C1 | 10 nF |
| C2 | 10 nF |
| D1 | RF Band Switching Diode eg BA277 |
| L1 | RF Choke eg 4.7 uH |
| L2 | RF Choke eg 4.7 uH |
| R1 | Bias resistor to supply 10 ma through diode D1 |
| R2 | Bias current resistor to supply 1 ma through the diode in U1 |
| R3 | Bias voltage resistor to bias the drain of MOSFET U1 |
| R4 | Voltage divider resistor to insure that the rated Drain voltage is not exceed |
| R5 | RF termination resistor. |

Although various embodiments of the invention have been shown and described, they are not meant to be limiting. Those of skill in the art may recognize certain modifications to the invention as taught, which modifications are meant to be covered by the spirit and scope of the appended claims. For example, in certain applications, the directional couplers can be replaced by splitters. Also, in the various embodiments of the invention, the use of a directional coupler and modem port can be eliminated from the amplifier device. However, if desired, an external directional coupler and external modem can be used to insure continuous VoIP even with the loss of power to the modem.

What we claim is:

1. An amplifier device for a cable antenna television system comprising:
    an amplifier for amplifying video/data signals having an input terminal, an output terminal, and a power terminal;
    at least a first video/data output port coupled to the output terminal of said amplifier;
    a cable drop input terminal for receiving VoIP, Internet, video and data signals;
    a power port for receiving a source of voltage, said power port being coupled to the power terminal of said amplifier;
    a source of reference potential;
    a modem port for connection to the modem of a user;
    a directional coupler having an input terminal connected to said cable drop input terminal, a first output terminal for outputting said VoIP and Internet signals to the modem port, and a second output terminal for outputting video and data signals to the input terminal of said amplifier;
    a 75 ohm resistor having a free end, and another end connected to the common connection between said directional coupler and said amplifier; and
    switching circuit means responsive to the loss of power or voltage to said amplifier, for electrically connecting the free end of said resistor to said source of reference potential.

2. The amplifier device of claim 1, wherein said switching circuit means further includes means responsive to the loss of power or voltage to said amplifier for disconnecting said amplifier from its common connection with said directional coupler.

3. The amplifier device of claim 1, further including:
    second and third video/data output ports; and
    a splitter having an input connected to said output terminal of said amplifier, and first through third output terminals connected to said first through third video/data output ports, respectively, for providing amplified video/data signals thereto.

4. The amplifier device of claim 3, further including:
    a first forward biased diode connected between said power port and said power terminal;
    an inductor for blocking high frequency signals; and
    a second forward biased diode connected in series with said inductor between said modem port and said power terminal.

5. The amplifier device of claim 1, further including:
    a first forward biased diode connected between said power port and said power terminal;
    an inductor for blocking high frequency signals; and
    a second forward biased diode connected in series with said inductor between said modem port and said power terminal.

6. The amplifier device of claim 1, further including:
    second through eighth video/data output ports; and
    a splitter having an input connected to said output terminal of said amplifier, and first through eighth video/data output terminals connected to said first through eighth video/data output ports, respectively, for providing amplified video/data signals thereto.

7. The amplifier device of claim 6, further including:
    a first forward biased diode connected between said power port and said power terminal;
    an inductor for blocking high frequency signals; and
    a second forward biased diode connected in series with said inductor between said modem port and said power terminal.

8. An amplifier device for a cable antenna television system comprising:
    an amplifier for amplifying video/data signals having an input terminal, an output terminal, and a power terminal;
    a plurality of video/data output ports coupled to the output terminal of said amplifier;
    a cable drop input terminal for receiving VoIP, Internet, video and data signals;
    a power port for receiving a source of voltage, said power port being coupled to the power terminal of said amplifier;
    a source of reference potential;
    a modem port for connection to the modem of a user;
    a directional coupler having an input terminal connected to said cable drop input terminal, a first output terminal connected for outputting said VoIP and Internet signals to the modem port, and a second output terminal connected for outputting video and data signals to the input terminal of said amplifier;
    a 75 ohm resistor having one end connected to the common connection of the second output terminal of said directional coupler and the input terminal of said amplifier, said resistor having a free end; and
    switching means connected between the free end of said resistor and said source of reference potential, responsive to the loss of power or voltage to said amplifier, for electrically connecting the free end of said resistor to said source of reference potential.

9. The amplifier device of claim 8, wherein said switching means further includes means responsive to the loss of power or voltage to said amplifier for disconnecting said amplifier from the second output terminal of said directional coupler.

10. The amplifier device of claim 8, further including:
    a splitter having an input terminal connected to the output terminal of said amplifier, and a plurality of output terminals connected to the plurality of video/data output ports, respectively, for coupling amplified video/data signals thereto.

11. The amplifier device of claim 10, further including:
a first forward biased diode connected between said power port and said power terminal;
an inductor for blocking high frequency signals; and
a second forward biased diode connected in series with said inductor between said modem port and said power terminal.

12. The amplifier of claim 10, wherein said directional coupler is passive.

13. The amplifier of claim 12, wherein said splitter is passive.

14. The amplifier of claim 10, wherein said splitter is passive.

15. The amplifier of claim 14, wherein said directional coupler is passive.

16. The amplifier device of claim 8, further including:
a first forward biased diode connected between said power port and said power terminal;
an inductor for blocking high frequency signals; and
a second forward biased diode connected in series with said inductor between said modem port and said power terminal.

17. The amplifier device of claim 8, wherein said directional coupler is passive.

18. An amplifier device comprising:
an input port for connection to a cable drop;
a directional coupler connected between said input port and a modem port;
an amplifier having an input and an output;
normally open switching means coupled between said directional coupler and the input of said amplifier;
a resistor having a free end, and another end connected to a common connection between said directional coupler, and said normally open switching means;
a source of reference potential;
normally closed switching means connected between the free end of said resistor and said source of reference potential;
a power port for receiving a source of electrical power for said amplifier;
said normally open switching being responsive to the application of power to said amplifier for closing to electrically connect said directional coupler to the input of said amplifier; and
said normally closed switching means being responsive to the application of power to said amplifier for opening to disconnect an electrical connection between the free end of said resistor and said source of reference potential.

19. The amplifier device of claim 18, wherein said resistor has a value of 75 ohms.

20. A CATV amplifier device comprising:
an amplifier having an input terminal and an output terminal;
a source of reference potential;
a power port for receiving power for said amplifier;
a resistor having one end connected to said source of reference potential, and another end; and
switching means having a first terminal for receiving video/data signals, a second terminal electrically connected to the input of said amplifier, and a third terminal electrically connected to the another end of said resistor, said switching means being responsive to the application of power to said amplifier for electrically connecting said first and second terminals together, and further being responsive to the loss of power to said amplifier for both removing the electrical connection between said first and second terminals, and for electrically connecting said first and third terminals together.

21. The amplifier device of claim 20, wherein said switching means consists of an electromechanical relay.

22. The amplifier device of claim 20, wherein said switching means consists of a solid-state switching circuit.

23. The amplifier device of claim 20, further including:
at least one video/data port;
a first diplex filter having an input terminal for receiving video/data signals, a low band terminal for low band video/data signals, and a high band terminal for high band video/data signals, said high band terminal being electrically connected to said first terminal of said switching means;
a second diplex filter having a high band terminal electrically connected to the output terminal of said amplifier, a low band terminal electrically coupled to the low band terminal of said first diplex filter, and an output terminal electrically coupled to said at least one video/data port.

24. The amplifier device of claim 20, wherein said amplifier is a bidirectional or forward/reverse amplifier.

25. A CATV amplifier device comprising at least one video/data port;
a first amplifier having an input terminal receptive of high band video/data signals, and an output terminal;
a second amplifier having an input terminal receptive of low band video/data signals, and an output terminal;
a first diplex filter having an input terminal electrically connected to said at least one video/data port, a low band terminal for low band video/data signals electrically connected to the input terminal of said second amplifier, and a high band terminal for high band video/data signals electrically connected to the output of said first amplifier;
a source of reference potential;
a power port for receiving electrical power for coupling to said first and second amplifiers;
a second diplex filter having an input terminal for receiving video/data signals, a low band terminal, and a high band terminal;
first switching circuit means including a resistor having one end connected to said source of reference potential, and another end, said first switching circuit mans being responsive to the application of power to said first amplifier, for electrically coupling the high band terminal of said second diplex filter to the input terminal of said first amplifier, and responsive to the loss of power to said first amplifier for both electrically decoupling said high band terminal of said second diplex filter from said first amplifier, and electrically coupling the another end of said resistor to the high band terminal of said second diplex; and
second switching circuit means including a resistor having one end connected to said source of reference potential, and another end, said second switching circuit means being responsive either to the application of power to said second amplifier for electrically coupling the low band terminal of said second diplex filter to the output terminal of said second amplifier, or to the loss of power to said second amplifier for decoupling its output terminal from said diplex filter, and electrically coupling the another end of said resistor to the low band terminal of said second diplex filter.

26. An amplifier system for a cable antenna television system comprising:

an amplifier for amplifying video/data signals having an input terminal, an output terminal, and a power terminal;
a cable drop input terminal for receiving VoIP, Internet, video and data signals;
circuit means for electrically coupling said cable drop input terminal to said input terminal of said amplifier;
a power port for receiving a source of voltage, said power port being coupled to the power terminal of said amplifier;
a source of reference potential;
a resistor having a free end, and another end coupled to said cable drop input terminal; and
said circuit means including switching means responsive to the loss of power or voltage to said amplifier, for electrically connecting the free end of said resistor to said source of reference potential, for maintaining a constant input impedance at said cable drop input terminal.

27. The amplifier device of claim 26, wherein said switching means further includes means responsive to the loss of power or voltage to said amplifier for disconnecting the input terminal of said amplifier from said cable drop input terminal.

28. A CATV amplifier system comprising:
an input terminal for receiving RF signals;
an amplifier including an input terminal, output terminal, and power terminal;
a source of power connected to said power terminal of said amplifier;
a source of reference potential;
a resistor having one end connected to said source of reference potential, and another end;
switching means both responsive to the application of power to said amplifier for connecting the input terminal of said amplifier to said signal input terminal, and to the loss of power to said amplifier for substantially simultaneously disconnecting said amplifier from said signal input terminal and connecting said another end of said resistor to said input terminal.

* * * * *